United States Patent
Yeh et al.

(10) Patent No.: US 8,058,182 B2
(45) Date of Patent: Nov. 15, 2011

(54) SURFACE MICROMACHINING PROCESS OF MEMS INK JET DROP EJECTORS ON GLASS SUBSTRATES

(75) Inventors: Chingwen Yeh, Cupertino, CA (US); James B. Boyce, Los Altos, CA (US); Kathleen Boyce, legal representative, Los Altos, CA (US); Jingkuang Chen, Rochester, NY (US); Feixia Pan, Cypress, CA (US); Joel A. Kubby, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 12/495,827

(22) Filed: Jul. 1, 2009

(65) Prior Publication Data

US 2011/0003405 A1 Jan. 6, 2011

(51) Int. Cl.
*H01L 21/469* (2006.01)
(52) U.S. Cl. .......... 438/763; 438/393; 29/25.35
(58) Field of Classification Search .......... 438/393, 438/763
See application file for complete search history.

(56) References Cited

U.S. PATENT DOCUMENTS

| | | | |
|---|---|---|---|
| 6,523,942 B2 * | 2/2003 | Sakamoto et al. | 347/68 |
| 7,564,613 B2 * | 7/2009 | Sasagawa et al. | 359/290 |
| 2001/0023523 A1 * | 9/2001 | Kubby et al. | 29/25.35 |
| 2004/0004592 A1 * | 1/2004 | Ikeda et al. | 345/85 |
| 2007/0024603 A1 * | 2/2007 | Li | 345/204 |
| 2007/0177129 A1 * | 8/2007 | Kothari et al. | 356/32 |
| 2007/0278075 A1 * | 12/2007 | Terano et al. | 200/181 |

OTHER PUBLICATIONS

Di Giovami, M., Flat and Corrugated Diaphragm Design Handbook, Marcel Dekker Inc., NY 1982, pp. 1-200.
Di Giovami, M., Flat and Corrugated Diaphragm Design Handbook, Marcel Dekker Inc., NY 1982, pp. 201-404.
Halg, B., "On a Nonvolatile Memory Cell Based on Micro-Electro-Mechanics", IEEE Workshop on Micro Electro Mechanical Systems, Napa Valley, CA, pp. 172-176, Feb. 1990.
Chen, Jingkuang et al., "A Monolithic Polyimide Nozzle Array for Inkjet Printing", Technical Digest, Solid-State Sensor and Actuator Workshop, Hilton Head, S.C., pp. 308-311, Jun. 1998.
Guerin, L.J. et al., "Simple and Low Cost Fabrication of Embedded Micro-channels by Using a New Thick-Film Photoplastic", Proc. Transducers 97, Chicago, IL, pp. 1419-1422, Jun. 1997.
Daniel, Jurgen H., "Micromachining Silicon for MEMS", Ph.D. Dissertation, University of Cambridge, U.K., pp. 50-51.

* cited by examiner

*Primary Examiner* — Fernando L Toledo
(74) *Attorney, Agent, or Firm* — Fay Sharpe LLP

(57) ABSTRACT

Method and device for forming a membrane includes providing a glass substrate, and depositing a thin layer of chromium on the glass substrate. The thin layer of chromium is patterned to form a deflection electrode and interconnect leads. A sacrificial layer of aluminum is deposited on top of the patterned chromium layer, then the sacrificial layer is patterned to define anchor regions. On top of the sacrificial layer, a thick layer of chromium is deposited, and the thick layer of chromium is patterned to form a membrane. The sacrificial layer is then etched to release the membrane.

18 Claims, 7 Drawing Sheets

SURFACE MICROMACHINING PROCESS OF MEMS INK JET DROP EJECTORS ON GLASS SUBSTRATES

BACKGROUND

The present application is directed to micro-electro-mechanical methods and devices, and more particularly to such devices and methods for the manufacture of fluid drop ejectors to eject fluid drops such as and biological material, among others.

A MEMS (micro-electro-mechanical system) drop ejector has been disclosed in U.S. patent application Ser. No. 11/863,637 (Publ. No. 2001-0023523), titled "Method Of Fabricating A Micro-Electro-Mechanical Fluid Ejector", by Kubby et al., filed May 23, 2001, incorporated herein in its entirety.

The Kubby et al. application described a micro-electro-mechanical fluid ejector fabricated by a standard polysilicon surface micro-machine process, which can be batch fabricated at low cost using existing external foundry capabilities. In addition, it is disclosed that the surface micro-machine process is proven to be compatible with integrated microelectronics, allowing for monolithic integration of the actuator with addressing electronics. A voltage drive mode and a charge drive mode for the power source actuating a deformable membrane is also disclosed.

FIG. 1 shows a cross-sectional view of an electrostatically actuated diaphragm 100 such as disclosed in Kubby et al. in the relaxed state. Substrate 120 is typically a silicon wafer. Insulator layer 130 is typically a thin film of silicon nitride, $Si_3N_4$. Conductor 140 acts as the counter or deflector electrode and is typically either a metal or a doped semiconductor film such as polysilicon. Membrane 150 is made from a structural material such as polysilicon, as is typically used in a surface micromachining process. Nipple 152 is attached to a part of membrane 150 and acts to separate the membrane from the conductor when the membrane is pulled down towards the conductor under electrostatic attraction when a voltage or current, as indicated by power source P, is applied between the membrane and the conductor. Actuator chamber (where a fluid may be located) 154 between membrane 150 and substrate 120 can be formed using typical techniques such as are used in surface micromachining. A sacrificial layer, such as chemical vapor deposition (CVD) oxide is deposited, which is then covered over by the structural material that forms the membrane. An opening left in the membrane (not shown) allows the sacrificial layer to be removed in a post-processing etch. A typical etchant for oxide is concentrated hydrofluoric acid (HF). In this processing step, nipple 152 acts to keep the membrane from sticking to the underlying surface when the liquid etchant capillary forces pull it down.

The standard surface micromachining process to manufacture drop ejectors such as shown in FIG. 1, among others, is limited to silicon substrates, thus restricting the size of a device array. In order to implement larger arrays, such as full-page-width ejector using a device array, a new fabrication process is required. It is therefore desirable to provide a method of manufacturing and new devices which allow for large area arrays as well as other improvements.

INCORPORATION BY REFERENCE

U.S. patent application Ser. No. 11/863,637 (Publ. No. 2001-0023523), titled "Method Of Fabricating A Micro-Electro-Mechanical Fluid Ejector", by Kubby et al., filed May 23, 2001; an article by Jingkuang Chen et al., entitled "A Monolithic Polyimide Nozzle Array for Inkjet Printing", Technical Digest, Solid-State Sensor and Actuator Workshop, Hilton Head, S.C., pp. 308-311, June 1998; and an article by L. J. Guerin et al., "Simple and Low Cost Fabrication of Embedded Micro-Channels by Using a New Thick-Film Photoplastic", Proc. Transducers 97, Chicago, pp. 1419-1422, June 1997, each of which are incorporated herein in their entirety.

BRIEF DESCRIPTION

Method and device for forming a membrane includes providing a glass substrate, and depositing a thin layer of chromium on the glass substrate. The thin layer of chromium is patterned to form a deflection electrode and interconnect leads. A sacrificial layer of aluminum is deposited on top of the patterned chromium layer, then the sacrificial layer is patterned to define anchor regions. On top of the sacrificial layer, a thick layer of chromium is deposited, and the thick layer of chromium is patterned to form a membrane. The sacrificial layer is then etched to release the membrane.

DETAILED DESCRIPTION

Figure 1:
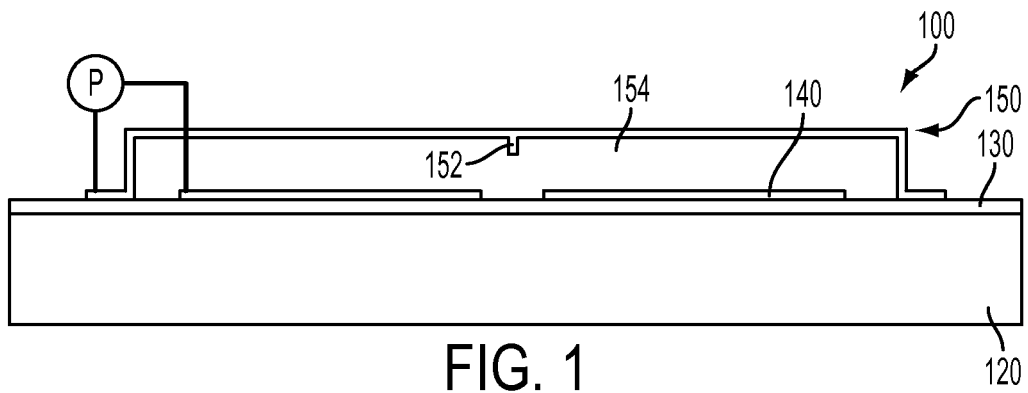
FIG. 1 shows a cross section of an electrostatically activated ink drop ejector.

As mentioned above in connection with FIG. 1, use of silicon substrates limits the size of an ejector device array which may be formed, and thus does not permit the useful manufacture of full-page-width or other large size drop ejection arrays. However, in large-area electronic applications such as flat panel displays and image sensors, glass is used as the substrate material. A particular advantage in this fabrication technology over a standard CMOS process is that glass substrates have a much larger area. In this present application, glass is therefore used as a substrate material for the fabrication of a drop ejector such as a MEMS drop ejector. Furthermore, using glass as a substrate material, amorphous-silicon (α-Si) thin film transistors (TFTs) can be monolithically integrated with the MEMS drop ejector as addressing electronics. In addition, the operating voltages (>50V) for TFTs are sufficiently high to deflect the membrane of the MEMS drop ejector.

There are, however, several requirements for the fabrication of a MEMS drop ejector on glass substrates. First, any high temperature process (>600° C.) is not available due to the use of glass as the substrate material. Unlike a standard surface micromachining process such as LPCVD (Low Pressure Chemical Vapor Deposition), polysilicon cannot be used as a structural layer. Second, thermal annealing, which is a usual way in MEMS processes to eliminate residual stress of the structural layers after deposition, cannot be performed after the α-Si TFTs fabrication process (<400° C.) even if it is only around 400-500° C. So, if it is required, thermal annealing needs to be done before the fabrication of addressing electronics. Third, one membrane with a large thickness (5-10 μm) may be needed in some embodiments to provide sufficient spring forces to eject fluid droplets. The deposition of polysilicon with such a thickness range is unusual and it may cause some process issues if standard surface micromachining process were used.

The present application discloses a surface micro-machine process for fabrication of MEMS drop ejectors for the ejection of fluids, including ink or biologic materials, among others, together with a Cr—Al fabrication process provided for low temperatures on a glass substrate. The standard surface micromachine process is limited to silicon substrates, thus restricting the array size of the resulting MEMS device. The present application teaches a process by which these drop ejectors can be batch fabricated using Cr—Al fabrication on large-area glass substrates at low substrates, thus implementing full-page-width printing of device arrays. In addition, processes described herein are compatible with the fabrication of α-Si TFTs. To accomplish the above, attention is first directed to the use of a membrane material in such a device.

After the membrane fabrication, the addressing electronics can be made on the same substrate using existing foundry capabilities of α-Si TFTs. It is to be noted that the membrane fabrication is compatible with the process of α-Si TFTs. Also, in the manufacturing of the drop ejector a nozzle plate can be added on the top of the membrane using polyimide such as taught in the industry, and including but not limited to the processes taught by Jingkuang Chen et al., in "A Monolithic Polyimide Nozzle Array for Inkjet Printing", Technical Digest, Solid-State Sensor and Actuator Workshop, Hilton Head, S.C., pp. 308-311, June 1998; and by L. J. Guerin et al., "Simple and Low Cost Fabrication of Embedded Micro-Channels by Using a New Thick-Film Photoplastic", Proc. Transducers 97, Chicago, pp. 1419-1422, June 1997, both of which are hereby incorporated by reference in their entirety.

The nozzle fabrication is a low temperature process (<200° C.) so that the electrical properties of α-Si TFTs for addressing electronics will not be affected significantly.

For a planar circular membrane, the load-deflection relationship is approximately given by:

$$\frac{Pa^4}{Eh^4} = \frac{16}{3(1-v^2)}\frac{y}{h} + \frac{7-v}{3(1-v^2)}\frac{y^3}{h^3} + \frac{4a^2\sigma}{(1-v)Eh^2}\frac{y}{h} \quad (1)$$

where P is the pressure applied uniformly on the membrane, y is the deflection of the membrane center under that pressure, E is the Young's modulus of the membrane material, v is the Poisson's ratio of the membrane material, σ is the residual stress of the membrane, and a and h are the radius and thickness of the membrane, respectively.

From Equation 1, if the thickness of the membrane is not large, the membrane material should have a reasonably high value of residual stress (tensile) to provide a large spring force with a small membrane deflection (Cracking may occur from the membrane edges if residual stress is too large.). In addition, residual stress (tensile) may prevent the membrane from sticking onto the substrate during fabrication and device operation.

For a given membrane material with a Young's modulus of 170 MPa (such as polysilicon), it is, for this example, assumed the radius and thickness of the membrane are 150 μm and 2 μm respectively. From simulation, if a uniform pressure of 0.15 MPa (e.g., required for ejecting ink droplets) is applied on the membrane, the deflection of the membrane center is reduced with increasing the residual stress of the membrane as follows:

| Residual Stress (MPa) | Deflection (μm) |
| --- | --- |
| 0 | 9.9 |
| 300 | 1.13 |
| 400 | 0.88 |

In one embodiment of this application, chromium is used as a membrane material since it has a value of residual stress (tensile) 200 MPa or larger (depending on the deposition condition) on glass substrates. In addition, the Young's modulus of chromium (140 MPa) is close to that of polysilicon.

Figure 2A:
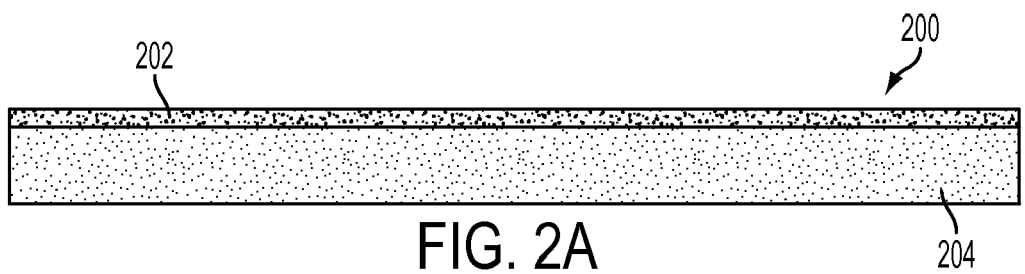
FIGS. 2A-2H illustrate a process flow for membrane fabrication according to the present application.

Since thermal annealing needs to be done prior to the fabrication of addressing electronics, the process steps for forming the membrane of the MEMS drop ejector are carried out first, as shown in FIGS. 2A-2G. The "dimple" structure at the center of the membrane (as shown in FIG. 1) to prevent stiction is not included here, although it can be included in other embodiments. A particular membrane fabrication process according to the present application is detailed as follows:

FIG. 2A: In process 200, a thin layer of chromium 202 (e.g., in one embodiment a few hundred Å or less) is deposited on a glass substrate 204.

Figure 2B:
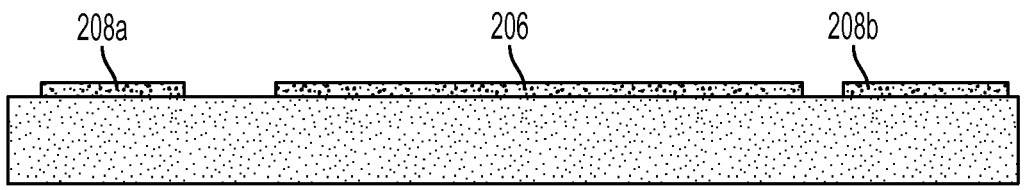

FIG. 2B: The thin chromium layer 202 is patterned to form a deflection electrode 206 as well as interconnect leads 208a, 208b.

Figure 2C:
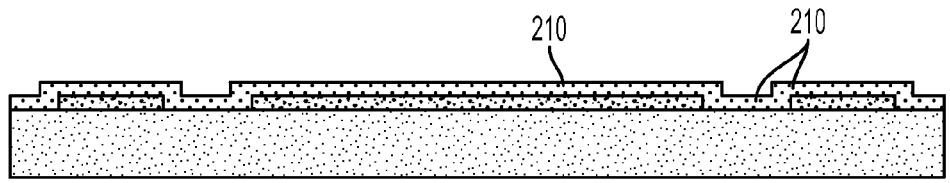

FIG. 2C: A sacrificial layer of aluminum 210 (e.g., e.g., in one embodiment less than 1 μm) is deposited including on the top of the deflection electrode 206, interconnect leads 208a, 208b, and the rest of the upper surface of the substrate 204.

Figure 2D:
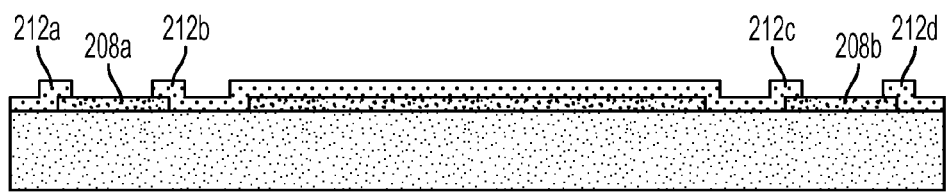

FIG. 2D: The sacrificial aluminum layer 210 is then patterned to define anchor regions 212a-212d for the membrane.

Figure 2E:
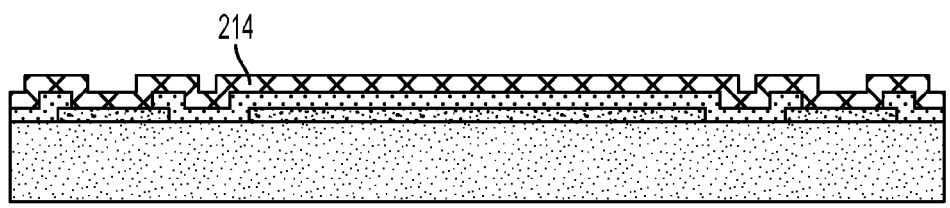

FIG. 2E: Next, a thick layer of chromium 214 (a few μm (e.g., anywhere between about 3-25 μm)) is deposited on the top of sacrificial layer 210. Thermal annealing can be performed to reduce the residual stress of the membrane material and its stress gradient if they are too large.

Figure 2F:
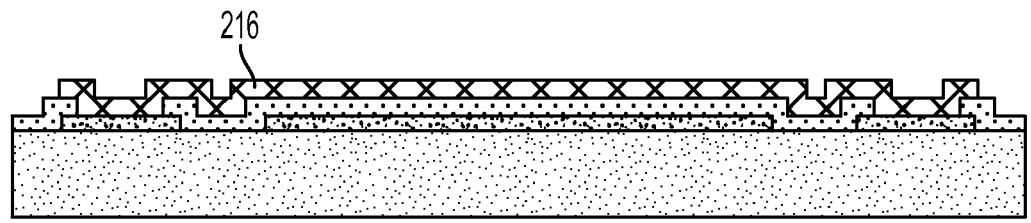

FIG. 2F: The thick chromium layer 214 of FIG. 2D is patterned to define membrane 216.

Figure 2G:
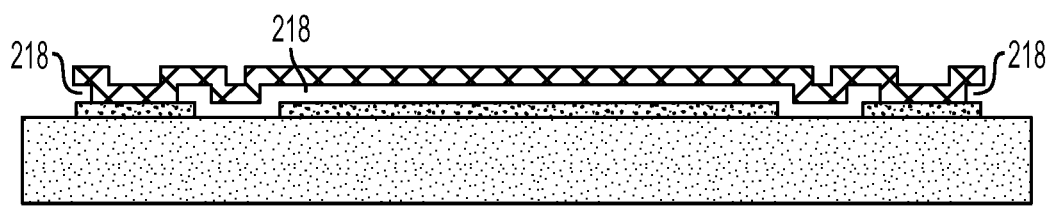

FIG. 2G: The sacrificial layer of aluminum 210 applied in FIG. 26 is etched away as shown by open areas 218 to release the membrane. Note that the standard aluminum etchant (79% phosphoric acid, 1% nitric acid, 10% acetic acid, and 10% water) has an extremely high etching selectivity of aluminum over chromium as well as glass. (The step may be done after the fabrication of addressing electronics.)

Figure 2H:
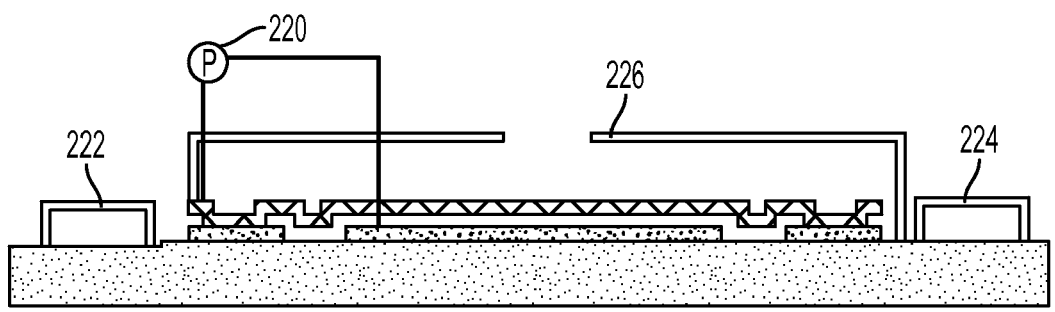

FIG. 2H: After (or before) the membrane fabrication, contacts to a power source 220 and addressing electronics 222, 224 are formed on the same substrate using existing foundry capabilities such as of α-Si TFTs. It is noted that the membrane fabrication is compatible with the process of α-Si TFTs. A nozzle plate 226 is added on the top of the membrane using a polyimide such as taught in Jingkuang Chen et al., "A Monolithic Polyimide Nozzle Array for Inkjet Printing", Technical Digest, Solid-State Sensor and Actuator Workshop, Hilton Head, S.C., pp. 308-311, June 1998, or such as taught in L. J. Guerin et al., "Simple and Low Cost Fabrication of Embedded Micro-Channels by Using a New Thick-Film Photoplastic", Proc. Transducers 97, Chicago, pp. 1419-1422, June 1997, both of which are hereby incorporated by reference in their entirety, or by other known processes using other known materials. The nozzle fabrication is a low temperature process (<200° C.) so that the electrical properties of α-Si TFTs for addressing electronics will not be affected significantly.

Figure 3:
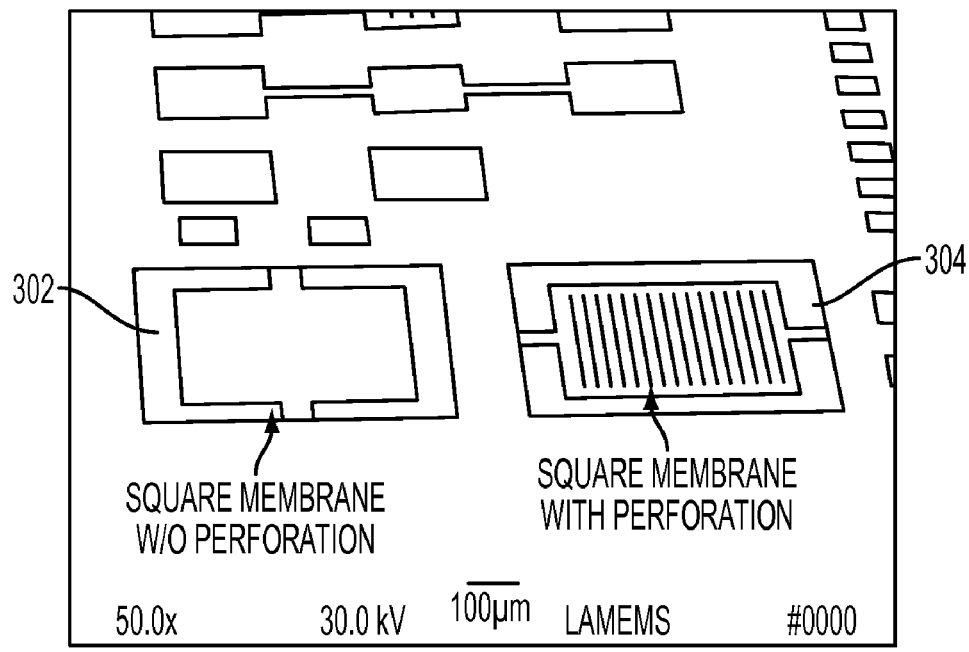
FIG. 3 illustrates a SEM view of a membrane prototype on glass.
Figure 4A:
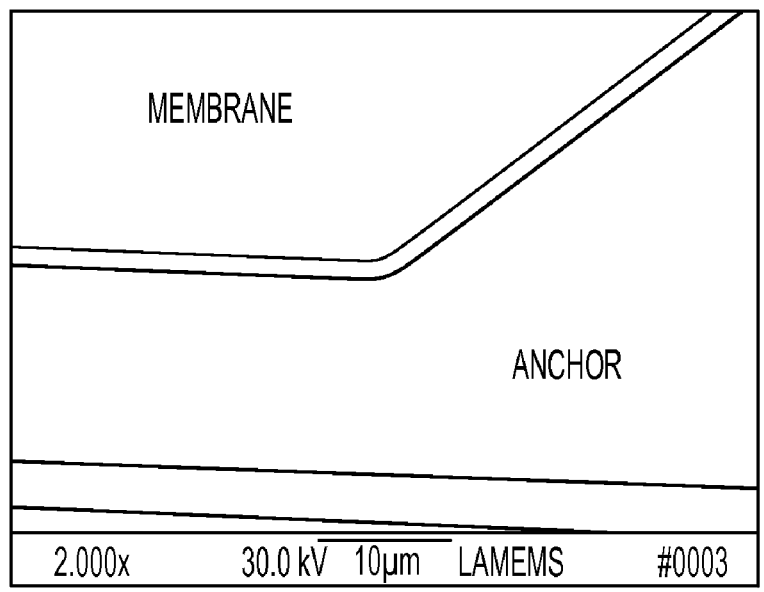
FIGS. 4A-4B illustrate closer SEM views of membrane prototypes.
Figure 4B:
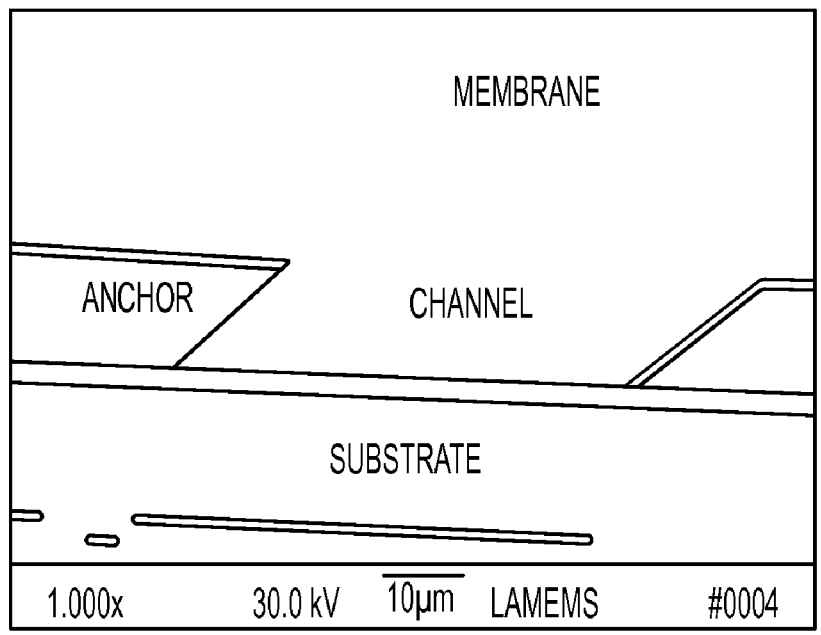

As shown in FIG. 3 under SEM (Scanning Electron Microscopy), two square membrane prototypes 302, 304 (each about 500 μm×500 μm) on glass substrates have been fabricated. The right one 304 has perforations to speed etching away of the sacrificial layer while the left one does not. In the prototypes, the thickness of the membrane is 2.6 μm, whereas the thickness of the sacrificial layer is 0.7-0.8 μm. Turning to FIG. 4A shown is one corner of a square membrane without perforation under SEM. Note that, even with residual stress (tensile), no cracking occurred on the membrane corners. FIG. 4B shows one of the channels that allow the aluminum etchant to enter the cavity under the membrane during release. The channels also allow passage of interconnection leads between a deflection electrode and a bonding pad.

Drying during release is a particular issue of the process steps in the membrane fabrication. A freeze-drying method such as taught in Jürgen H. Daniel, Micromachining Silicon for MEMS, Ph.D. Dissertation, University of Cambridge, U.K., pp. 50-51, 1999, could not be used here since it was found that a significant amount of residue was left on the chromium films or layers. In one embodiment of the membrane fabrication, the device dies were dipped in IPA (Isopropanol Alcohol) and methanol after DI water rinse. And then they were placed on a hot plate at 40° C. to evaporate methanol.

Figure 5A:
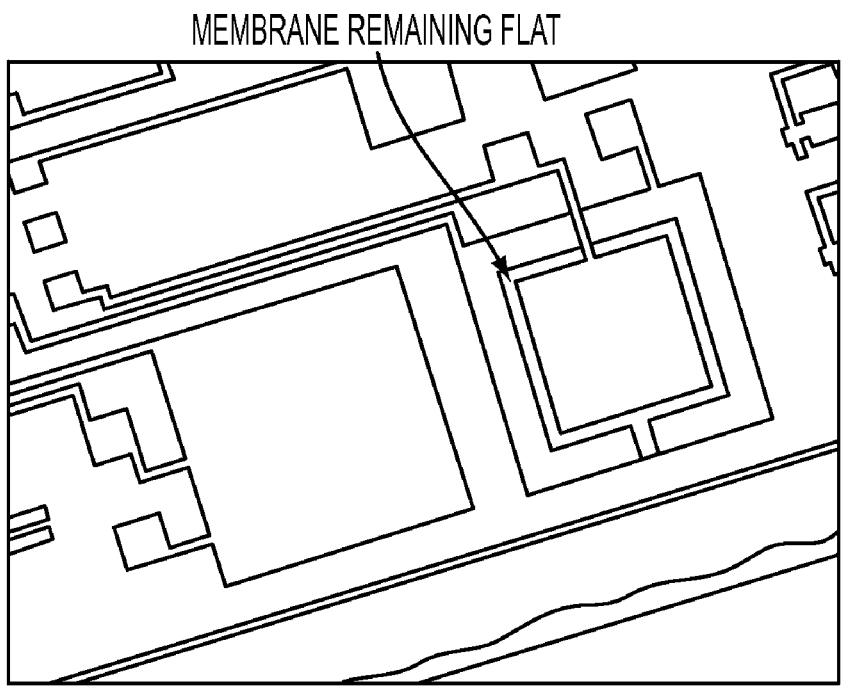
FIG. 5A is a membrane remaining flat after release, according to the present concepts.
Figure 5B:
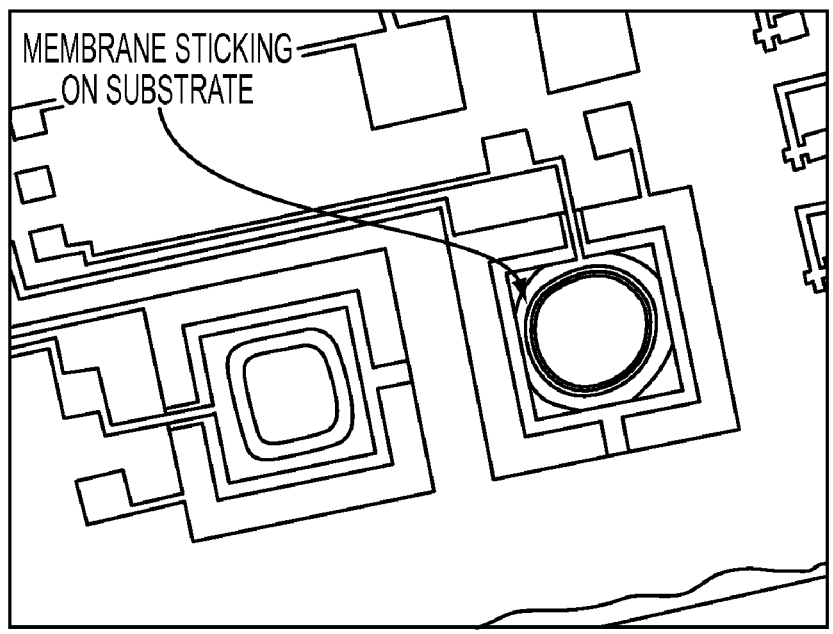
FIG. 5B is a membrane sticking on the substrate.
Figure 5C:
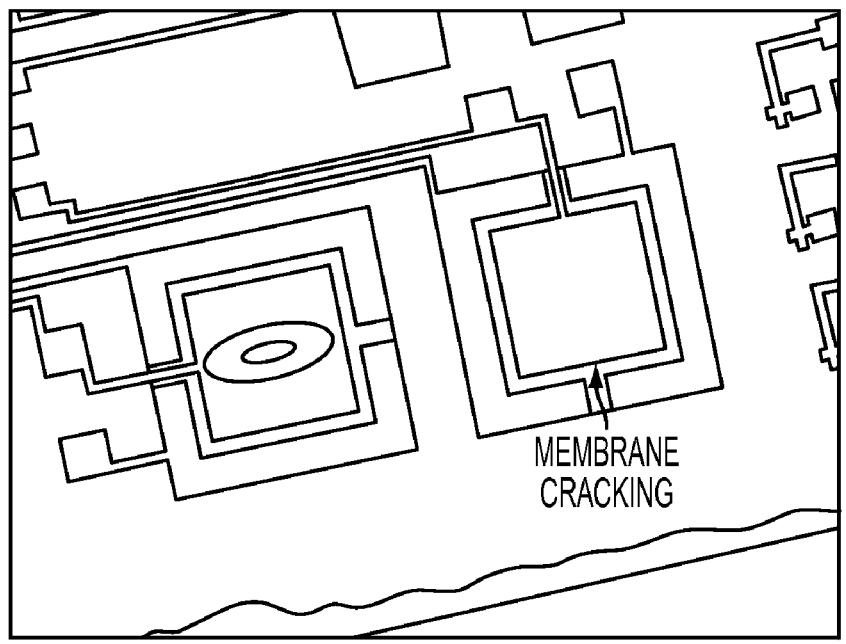
FIG. 5C depicts a membrane cracking situation.

Turning to FIG. 5A shown is a membrane remaining flat after release. Note that, if the temperature of the hot plate was too low, the surface tension created by the liquid leaving the cavity pulled the membrane into contact with the deflection electrode, thus causing the membrane sticking on the substrate. On the other hand, if the temperature of the hot plate was too high, the evaporated solvent burst through the membrane. FIG. 5B exhibits the central area of one membrane sticking on the substrate. FIG. 5C exhibits one cracked membrane, where the bottom half of the membrane looks dark (due to membrane warping far from the substrate).

Figure 6:
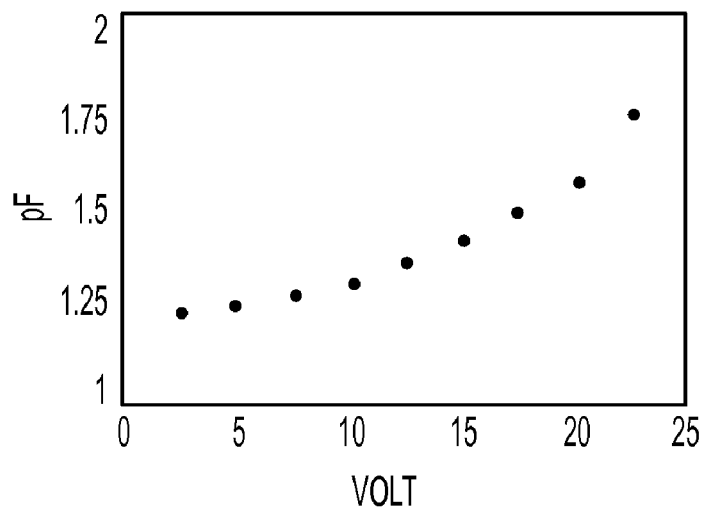
FIG. 6 shows measured capacitance change versus applied voltage for membrane prototypes.
Figure 7:
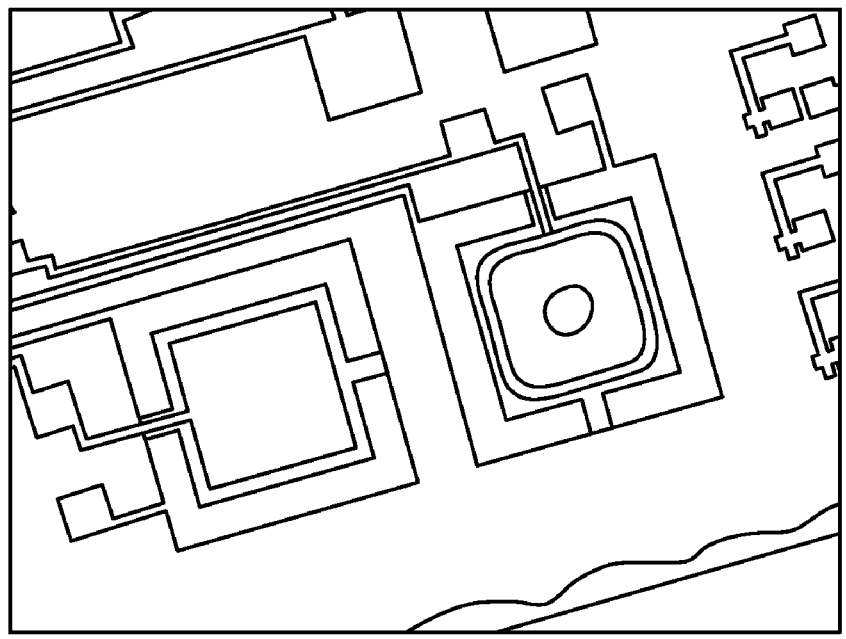
FIG. 7 depicts membrane damaged by electrostatic pulling.

Some preliminary measurements have been performed. By applying a voltage difference between the membrane and deflection electrode, such as shown in FIGS. 2A-2H the membrane was pulled toward the deflection electrode, thus resulting in a capacitance change on the membrane as shown in the graph of FIG. 6. As the applied voltage increased to 25V, the membrane was damaged by electrostatic pull-in (see FIG. 7). It was noted that the zero-bias capacitance was, in this investigation, about 1.2 pF and the value is less than expected from calculation (e.g., 2.5-3 pF). It was considered this difference could be caused by the membrane bending slightly.

The foregoing has disclosed a new MEMS drop ejector array and a new surface micro-machining process for the fabrication of such a MEMS drop ejector, together with a Cr—Al fabrication process modified for low temperatures on a glass substrate. Existing standard surface micro-machining processes are substantially limited to silicon substrates, thus restricting the array size of the resulting MEMS devices. This application teaches a process by which these drop ejectors can be batch fabricated using Cr—Al on large-area glass substrates at low temperatures, thus implementing the large arrays including but not limited to a full-page-width printing device array. In addition, the processes are compatible with the fabrication of α-Si TFTs. It is to be understood the processes described herein may, in addition to MEMS drop arrays, be used for different types of structures, as well as TFT arrays, at low temperatures on a low cost substrate.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for fabricating a membrane comprising:
providing a glass substrate;
depositing a thin layer of chromium on the glass substrate;
patterning the thin layer of chromium to form a deflection electrode and interconnect leads;
depositing a sacrificial layer of aluminum on top of the patterned chromium layer;
patterning the sacrificial layer to define anchor regions;
depositing on top of the sacrificial layer a thick layer of chromium;
patterning the thick layer of chromium to form a membrane; and
etching the sacrificial layer of aluminum to release the membrane.

2. The method according to claim 1, wherein the thin layer of chromium is a few hundred Å thick, but less than about 3 μm thick, and more than zero μm thick.

3. The method according to claim 1, wherein the sacrificial layer of aluminum is less than 1 μm thick.

4. The method according to claim 1, wherein the thick layer of chromium is anywhere between about 3 μm to about 25 μm thick.

5. The method according to claim 1, further including forming a nozzle plate over the membrane.

6. The method according to claim 1, wherein the nozzle plate is formed using a low temperature process of <200° C.

7. The method according to claim 1, further including forming addressing electronics on the substrate.

8. The method according to claim 6, wherein the addressing electronics are formed using α-Si TFT technology.

9. A method of forming a device comprising:
providing a glass substrate;
depositing a thin layer of chromium on the glass substrate;
patterning the thin layer of chromium;
depositing a sacrificial layer of aluminum on top of the patterned chromium layer;
patterning the sacrificial layer;
depositing on top of the sacrificial layer a thick layer of chromium; and
patterning the thick layer of chromium to form the device.

10. A MEMS ink drop device comprising:
a glass substrate;
a thin layer of chromium forming a deflection electrode and interconnect leads and anchor regions;
a thick layer of chromium separated from the thin layer of chromium to form a membrane; and
a space configured to separate at least some portions of the thin layer of chromium from the thick layer of chromium, the space defined by a sacrificial layer of aluminum.

11. The device according to claim 10, wherein the thin layer of chromium is a few hundred Å thick, but less than about 3 μm or loss thick, and more than zero μm thick.

12. The device according to claim 10, wherein the thick layer of chromium is anywhere between about 3 μm to about 25 μm thick.

13. The device according to claim 10, further including a nozzle plate formed over the membrane.

14. The device according to claim 13, wherein the nozzle plate is formed using a low temperature process of <200° C.

15. The device according to claim 10, further including monolithically integrated addressing electronics formed on the substrate.

16. The device according to claim 15, wherein the addressing electronics are formed using α-Si TFT technology.

17. The method according to claim 1 being a batch fabrication process.

18. The device according to claim 10 being a full-page width printing device.

* * * * *